US012777715B2

(12) United States Patent
Jeon et al.

(10) Patent No.: US 12,777,715 B2
(45) Date of Patent: Oct. 27, 2026

(54) CHIP ON FILM PACKAGE INCLUDING PROTECTIVE LAYER AND DISPLAY DEVICE INCLUDING THE SAME

(71) Applicant: LX SEMICON CO., LTD., Daejeon (KR)

(72) Inventors: Min Ho Jeon, Daejeon (KR); Dam Ha, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 381 days.

(21) Appl. No.: 18/461,188

(22) Filed: Sep. 5, 2023

(65) Prior Publication Data

US 2024/0079418 A1 Mar. 7, 2024

(30) Foreign Application Priority Data

Sep. 6, 2022 (KR) ........................ 10-2022-0112576

(51) Int. Cl.
*H10D 86/40* (2025.01)

(52) U.S. Cl.
CPC .................................. *H10D 86/443* (2025.01)

(58) Field of Classification Search
CPC .............................. H10D 86/60; H10D 86/443
See application file for complete search history.

(56) References Cited

U.S. PATENT DOCUMENTS

2008/0128902 A1* 6/2008 Chung ................ H01L 23/4985 257/E23.021
2014/0233249 A1* 8/2014 Lee ..................... H10W 70/688 257/668
2016/0218065 A1* 7/2016 Ha ...................... H01L 23/5286
2019/0319082 A1* 10/2019 Nam ................... G02F 1/13458
2022/0013476 A1* 1/2022 Park .................... H01L 23/4985

FOREIGN PATENT DOCUMENTS

KR 10-2009-0053453 A 5/2009
KR 10-2014-0103548 A 8/2014

* cited by examiner

*Primary Examiner* — Eliseo Ramos Feliciano
*Assistant Examiner* — Timothy Edward Duren
(74) *Attorney, Agent, or Firm* — ROTHWELL, FIGG, ERNST & MANBECK, P.C.

(57) ABSTRACT

Disclosed herein is a chip on film package including a base film, output wiring disposed on the base film and extending along a first direction, an insulation layer overlapping at least a portion of the output wiring, an output pad portion defined as a region in which the output wiring is exposed without the insulation layer, a semiconductor chip mounted on the base film and electrically connected to the output wiring, and a protective layer disposed between the semiconductor chip and the output pad portion with respect to the first direction.

20 Claims, 5 Drawing Sheets

CHIP ON FILM PACKAGE INCLUDING PROTECTIVE LAYER AND DISPLAY DEVICE INCLUDING THE SAME

This application claims the benefit of Korean Patent Application No. 10-2022-0112576, filed on Sep. 6, 2022, which is hereby incorporated by reference as if fully set forth herein.

BACKGROUND OF THE DISCLOSURE

Technical Field

The present disclosure relates to a chip-on-film package including a protective layer and a display device including the same.

Background

Display devices that display images include liquid crystal displays (LCDs) that employ liquid crystals and organic light emitting diode (OLED) displays that employ organic light emitting diodes. With the recent development of these display devices, the manufacturing industry of drive chip packages included in display devices is also developing.

In particular, chip on film (COF) packages, in which semiconductor chips are mounted on a printed circuit board in the form of a film, have been applied to display devices. The COF is a technology for mounting semiconductor chips on polyimide films with circuitry, using an anisotropic conductive film or solder bumps, which enables the miniaturization of semiconductor chips and is suitable for lightweight miniaturization of packages because the material is flexible.

However, the COF packages can be damaged by external impacts including interference with internal elements of the display device.

SUMMARY

An object of the present disclosure devised to solve the above-mentioned problems is to provide a chip-on-film package including a protective layer and a display device including the same.

To achieve these objects and other advantages and in accordance with the purpose of the disclosure, as embodied and broadly described herein, a chip on film package includes a base film, output wiring disposed on the base film and extending along a first direction, an insulation layer overlapping at least a portion of the output wiring, an output pad portion defined as a region in which the output wiring is exposed without the insulation layer, a semiconductor chip mounted on the base film and electrically connected to the output wiring, and a protective layer disposed between the semiconductor chip and the output pad portion with respect to the first direction.

It is to be understood that both the foregoing general description and the following detailed description of the present disclosure are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Figure 1:
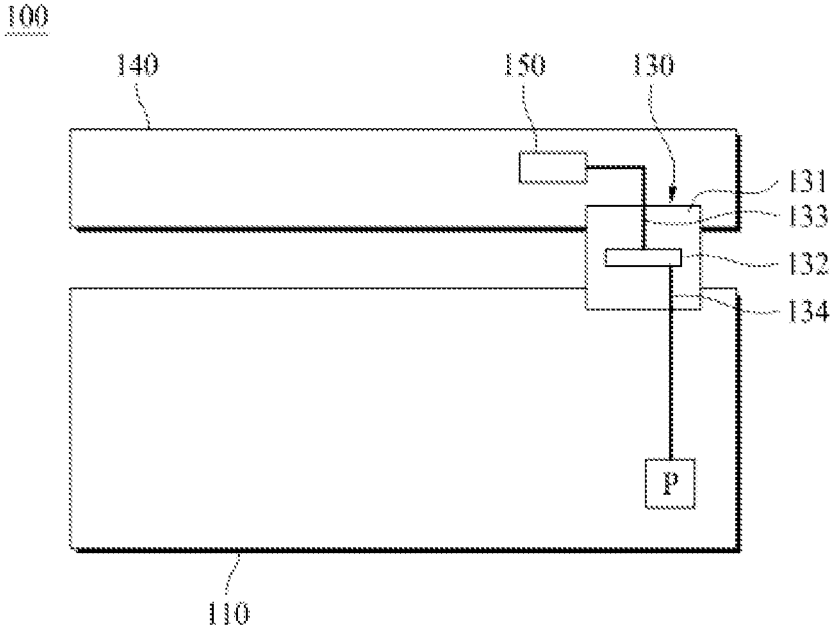
FIG. 1 is a configuration view of a display device including a chip on film according to one embodiment of the present disclosure.

Throughout the specification, like reference numerals are used to refer to substantially the same components. In the following description, detailed descriptions of components and features known in the art may be omitted if they are not relevant to the core configuration of the present disclosure. The meanings of terms used in this specification are to be understood as follows.

The advantages and features of the present disclosure, and methods of achieving them, will become apparent from the detailed description of the embodiments, together with the accompanying drawings. However, the present disclosure is not limited to the embodiments disclosed herein and will be implemented in many different forms. The embodiments are provided merely to make the disclosure of the present invention thorough and to fully inform one of ordinary skill in the art to which the present disclosure belongs of the scope of the invention. It is to be noted that the scope of the present disclosure is defined only by the claims.

The figures, dimensions, ratios, angles, numbers of elements given in the drawings are merely illustrative and are not limiting. Like reference numerals refer to like elements throughout the specification. Further, in describing the present disclosure, descriptions of well-known technologies may be omitted in order to avoid obscuring the gist of the present disclosure.

As used herein, the terms “includes,” “has,” “comprises,” and the like should not be construed as being restricted to the means listed thereafter unless specifically stated otherwise. Where an indefinite or definite article is used when referring to a singular noun e.g. “a” or “an”, “the”, this includes a plural of that noun unless something else is specifically stated.

Elements are to be interpreted a margin of error, even if not explicitly stated otherwise.

In describing temporal relationships, terms such as “after,” “subsequent to,” “next to,” “before,” and the like may include cases where any two events are not consecutive, unless the term “immediately” or “directly” is explicitly used.

While the terms first, second, and the like are used to describe various elements, the elements are not limited by these terms. These terms are used merely to distinguish one element from another. Accordingly, a first element referred to herein may be a second element within the technical idea of the present disclosure.

It should be understood that the term "at least one" includes all possible combinations of one or more related items. For example, the phrase "at least one of the first, second, and third items" can mean each of the first, second, or third items, as well as any possible combination of two or more of the first, second, and third items.

Features of various embodiments of the present disclosure can be partially or fully combined. As will be clearly appreciated by those skilled in the art, various interactions and operations are technically possible. Embodiments can be practiced independently of each other or in conjunction with each other.

Hereinafter, a chip on film and a display device including the chip on film according to one embodiment of the present disclosure will be described in detail with reference to FIGS. 1 to 5.

Figure 2:
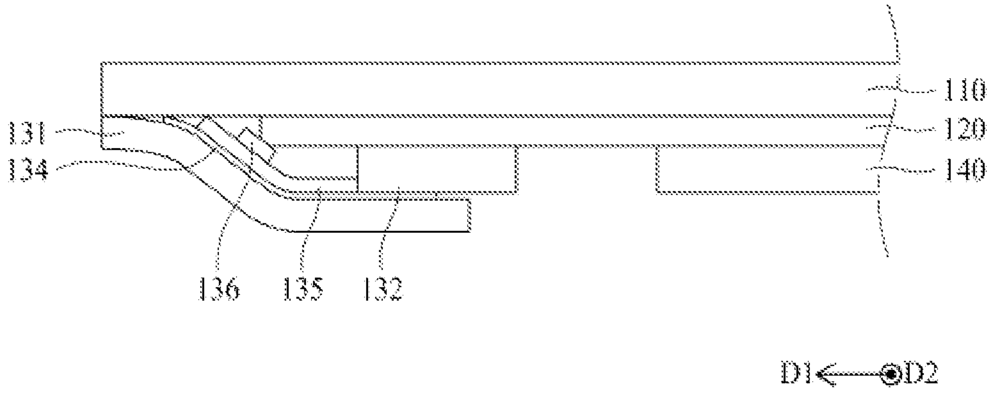
FIG. 2 is a side view of the display device including the chip on film according to one embodiment of the present disclosure.
Figure 3:
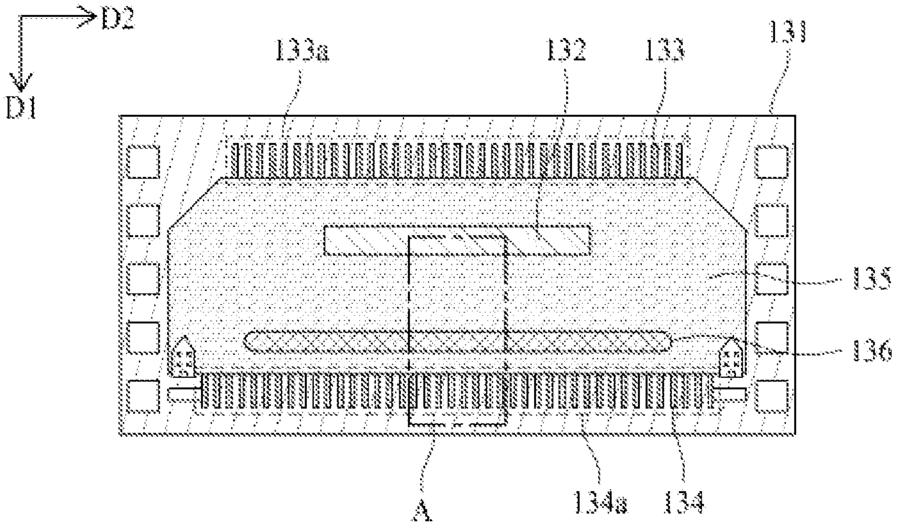
FIG. 3 is a plan view of a chip on film package according to one embodiment of the present disclosure.
Figure 4:
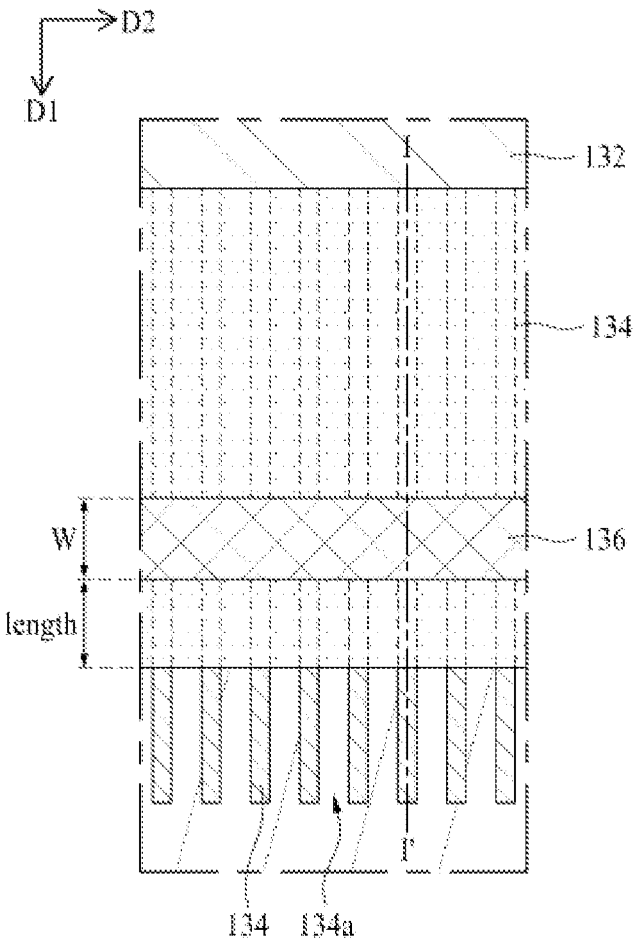
FIG. 4 is a view illustrating portion A of FIG. 3.

FIG. 1 is a configuration view of a display device including a chip on film according to one embodiment of the present disclosure, and FIG. 2 is a side view of the display device including the chip on film according to one embodiment of the present disclosure. FIG. 3 is a plan view of a chip on film package according to one embodiment of the present disclosure, and FIG. 4 is a view illustrating portion A of FIG. 3.

Referring to FIGS. 1 and 2, the display device 100 may include a display panel 110, a panel mechanism 120, a chip on film package 130, and a circuit board 140.

The display panel 110 may include a plurality of data lines and a plurality of gate lines, and may include a plurality of pixels P defined by intersections of the data lines and gate lines. The pixels P are driven by a data drive signal supplied through the data lines to display an image. Here, the data drive signal may be supplied by a semiconductor chip 132 included in the chip on film package 130.

The panel mechanism 120 may be disposed between the display panel 110 and the chip on film package 130, which will be described later, and may apply a physical impact to the chip on film package 130. Specifically, the panel mechanism 120 may apply physical impact to the output wiring 134 and the insulation layer 135 of the chip on film package 130 to affect the connection state of the output wiring 134. Accordingly, to prevent physical impact applied by the panel mechanism 120, the chip on film package 130 according to one embodiment of the present disclosure includes a protective layer 136, which will be described later. That is, the protective layer 136 is disposed between the panel mechanism 120 and the output wiring 134 and insulation layer 135 to prevent physical impact from the panel mechanism 120 from being applied to the output wiring 134 and insulation layer 135.

The chip on film package 130 is connected to the display panel 110 and the circuit board 140, as shown in FIGS. 1 and 2, to supply a data drive signal to the display panel 110 based on image data received from a control circuit 150 included in the circuit board 140, as described above.

The chip on film package 130 includes a base film 131, a semiconductor chip 132, input wiring 133, output wiring 134, pad portions 133*a*, 134*b*, an insulation layer 135, and a protective layer 136.

The base film 131 may be formed as a plastic film. For example, the base film 110 may be a sheet or film including, but not limited to, a cellulose resin such as triacetyl cellulose (TAC) or diacetyl cellulose (DAC), a cyclo olefin polymer (COP) or cyclo olefin copolymer (COC) such as norbornene derivatives, an acrylic resin such as poly(methylmethacrylate) (PMMA), a polycarbonate (PC), polyolefin such as polyethylene (PE) or polypropylene (PP), polyvinyl alcohol (PVA), poly ether sulfone (PES), polyetheretherketone (PEEK), polyetherimide (PEI), polyethylenenaphthalate (PEN), polyethyleneterephthalate (PET), polyimide (PI), polysulfone (PSF), or fluoride resin.

The semiconductor chip 132 is mounted on the pad portions 133*a*, 134*a* via bumps (not shown). That is, the semiconductor chip 132 is positioned on the base film 110 and the pad portions 133*a*, 134*a* and is electrically connected to the pad portions 133*a*, 134*a*. In this case, the bumps may be bonded and connected to the pad portions 133*a*, 134*a* formed on the base film 110 using a technique of tape automated bonding (TAB). Accordingly, the semiconductor chip 122 generates a data drive signal according to the input signal received through the input pad portion 133*a* and outputs the same through the output pad portion 134*a*.

The semiconductor chip 132 may be a source drive integrated circuit (SDIC) that supplies the data drive signal, and may generate the data drive signal based on image data received from the control circuit 150 included in the circuit board 140. The image data received from the control circuit 150 may include data indicative of the brightness of the pixels P, and the semiconductor chip 132 may convert such data and output the converted data to the display panel 110.

The semiconductor chip 132 receives the image data from the control circuit 150 through the input wiring 133 and outputs the converted image data to the display panel 110 through the output wiring 134.

The input wiring 133 may be disposed extending from one end of the base film 131 to the semiconductor chip 132, and the output wiring 134 may be disposed extending from the opposite end of the base film 131 to the semiconductor chip 132. For example, as shown in FIG. 3, the input wiring 133 and the output wiring 134 may extend along a first direction D1. A plurality of input wires 133 and a plurality of output wirings 134 may be arranged from the opposite end of the base film 131 along a second direction D2.

The input wiring 133 and output wiring 134 may be formed by bonding a metal thin film on the surface of the base film 110 by an electrodeposition or hot pressing process, followed by a photolithography and etching process. For example, the input wiring 133 and output wiring 134 may be formed of copper (Cu), gold (Au), tin (Sn), lead (Pb), silver (Ag), nickel (Ni), or the like. However, the method of forming the input wiring 133 and output wiring 134 is not limited thereto.

The pad portions 133*a*, 134*a* may be defined as regions where the input wires 133 and the output wirings 134 are exposed without the insulation layer 135, which will be described later, disposed thereon in the areas at the one end and opposite end of the base film 131 where the input wires 133 and the output wirings 134 are disposed. Accordingly, the chip on film package 130 may be electrically connected to the display panel 110 and the circuit board 140 via the pad portions 133*a*, 134*a*.

The pad portions 133*a*, 134*a* may include an input pad portion 133*a* and an output pad portion 134*a*, as shown in FIG. 3. The input pad portion 133*a* is defined, as described above, as a region where the input wires 133 are exposed without the insulation layer 135 disposed thereon in the area at one end of the base film 131 where the input wires 133 are disposed, and may be electrically connected to the circuit board 140. The output pad portion 134*a* is defined as a region where the output wirings 134 are exposed without the insulation layer 135 disposed thereon in the area at the opposite end of the base film 131 where the output wirings 134 are positioned, and may be electrically connected to the display panel 110. Accordingly, as shown in FIG. 3, the input pad portion 133*a* and the output pad portion 134*a* are each disposed on the base film 131 to extend along the second direction D2.

The insulation layer 135 is disposed on the input wiring 133 and the output wiring 134 to electrically insulate the input wiring 133 and the output wiring 134. To this end, the insulation layer 135 may be formed of a solder-resist. Accordingly, the insulation layer 135 may be insulated from the outside and may protect the input wires 133 and the output wirings 134 from external moisture or dust.

The insulation layer 135 may be positioned to overlap a portion of the semiconductor chip 132. The insulation layer 135 may be positioned to overlap an edge of the semiconductor chip 132 and may have a certain thickness to support the semiconductor chip 132.

Although not shown, the chip on film package 130 may further include a potting resin disposed on a side of the semiconductor chip 132 mounted on the base film 131. The potting resin may prevent moisture from penetrating through a gap between the insulation layer 135 and the semiconductor chip 132 while securing the semiconductor chip 132, and may prevent failure caused by movement of the input wiring 133, the output wiring 134, and the semiconductor chip 132 that may result from physical impact.

As shown in FIGS. 3 and 4, the protective layer 136 may be disposed between the semiconductor chip 132 and the output pad portion 134*a* with respect to the first direction D1. Accordingly, the protective layer 136 may be disposed between the chip on film package 130 and the display panel 110, as shown in FIG. 2, to prevent physical impact from being applied to the chip on film package 130 by the panel mechanism 120. Specifically, as shown in FIG. 2, the protective layer 136 may be disposed between the base film 131, on which the output wiring 134 and the insulation layer 135 are formed, and the panel mechanism 120, thereby preventing physical impact from being applied to the base film 131, the output wiring 134, and the insulation layer 135 by the panel mechanism 120.

As shown in FIGS. 3 and 4, in order to protect the output wiring 134, the protective layer 136 may be positioned overlapping at least a portion of the output wiring 134. That is, the protective layer 136 may be positioned overlapping a portion of the output wirings 134, or may be positioned overlapping the entirety of the output wiring 134. Accordingly, the protective layer 136 may have a width less than or equal to that of the insulation layer 135 with respect to the second direction D2.

Figure 5:
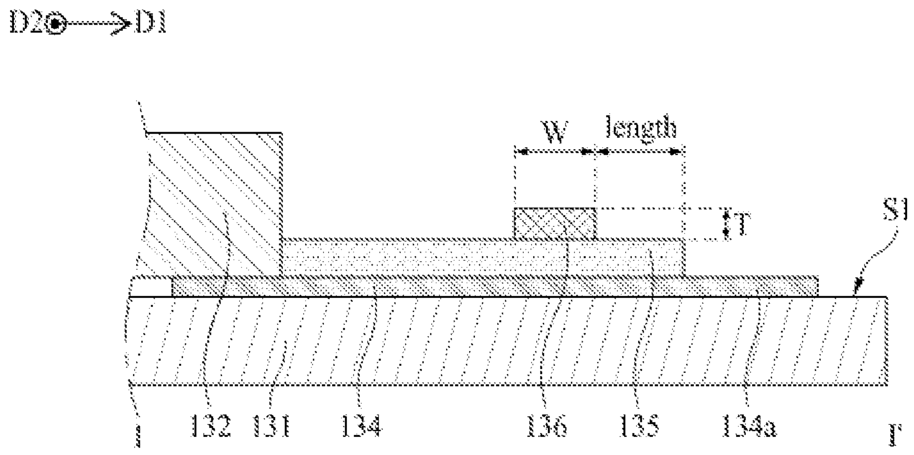
FIG. 5 is a cross-sectional view taken along I-I' of FIG. 4.

As shown in FIGS. 4 and 5, the protective layer 136 may have a width W greater than or equal to a predetermined minimum width in the first direction D1. For example, the protective layer 136 may have a width W of 1 mm or more in the first direction D1. Accordingly, the protective layer 136 may effectively prevent physical impact from being applied to the base film 131, the output wiring 134, and the insulation layer 135 by the panel mechanism 120.

The protective layer 136 is spaced apart from the output pad portion 134*a* by a length greater than or equal to a predetermined minimum spacing distance for reliable bonding of the output pad portion 134*a* with the display panel 110. For example, the protective layer 136 is spaced apart from the output pad portion 134*a* by a distance of 100 um or more. Accordingly, a step caused by the protective layer 136 does not occur in the output pad portion 134*a*, and thus the output pad portion 134*a* may be effectively bonded to the display panel 110.

The protective layer 136 may have a thickness T greater than or equal to a predetermined minimum thickness. For example, the protective layer 136 may have a thickness T of 15 um or more to effectively protect the base film 131, the output wiring 134, and the insulation layer 135.

As shown in FIGS. 4 and 5, the protective layer 136 may be positioned on the output wiring 134 and the insulation layer 135. Further, the protective layer 136 may be disposed in the same plane as the semiconductor chip 132. Specifically, as shown in FIG. 5, the protective layer 136 may be disposed on a first surface S1 of the base film 131 on which the semiconductor chip 132 is mounted, and may be disposed on the first surface S1 of the base film 131 on which the input wiring 133, the output wiring 134, and the insulation layer 135 are formed.

The protective layer 136 may include a resin. For example, the protective layer 136 may include resins such as an epoxy resin, a UV resin, a polyester resin, and a polyurethane resin.

Although not shown, the chip on film package 130 may further include a heat dissipator made of metal that is overlapping or adjacent to the semiconductor chip 132 to dissipate heat generated from the semiconductor chip 132.

Referring back to FIG. 1, the circuit board 140 includes a control circuit 150 configured to control the display panel 110. The control circuit 150 may include circuits configured to provide image data to the semiconductor chip 132 of the chip on film package 130. For example, the control circuit 150 may include a timing controller that receives an image signal from an external host and outputs timing signals and image data. However, the control circuit 150 is not limited thereto. The control circuit 150 may further include a touch sensing circuit, which is a circuit for sensing touch.

Hereinafter, a method of manufacturing a chip on film package according to one embodiment of the present disclosure will be described in detail with reference to FIGS. 6 and 7.

Figure 6:
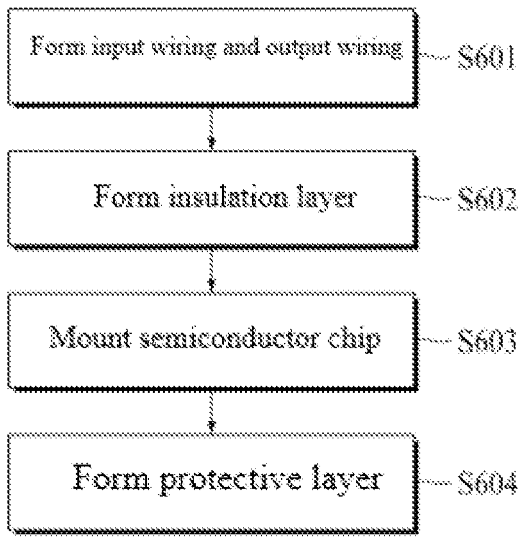
FIG. 6 is a flowchart of a method of manufacturing a chip on film package according to one embodiment of the present disclosure.
Figure 7:
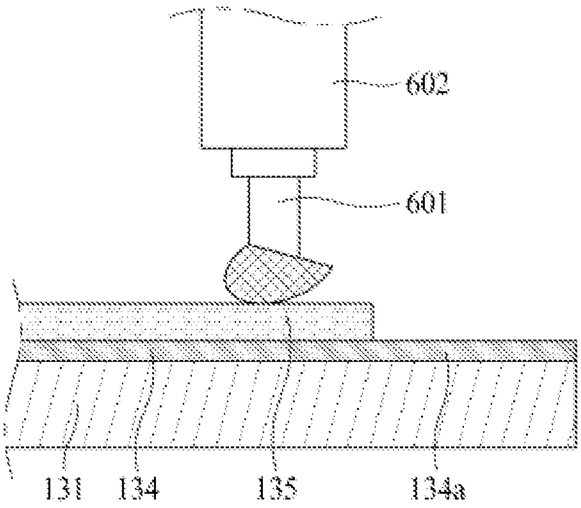
FIG. 7 is a view illustrating a method of forming a protective layer of the chip on film package according to one embodiment of the present disclosure.

FIG. 6 is a flowchart of a method of manufacturing a chip on film package according to one embodiment of the present disclosure, and FIG. 7 is a view illustrating a method of forming a protective layer of the chip on film package according to one embodiment of the present disclosure.

Referring to FIG. 6, input wiring 133 and output wiring 134 are formed on a base film 131 (S601). As described above, the base film 131 may be formed as a plastic film, and the input wiring 133 and output wiring 134 may be formed by bonding a metal thin film on the surface of the base film 110 by an electrodeposition or hot pressing process, followed by a photolithography and etching process. For example, the input wiring 133 and output wiring 134 may be formed of copper (Cu), gold (Au), tin (Sn), lead (Pb), silver (Ag), nickel (Ni), or the like. However, the method of forming the input wiring 133 and output wiring 134 is not limited thereto.

Then, an insulation layer 135 is formed on the input wiring 133 and the output wiring 134 (S602). The insulation layer 135 may be made of a solder-resist. Accordingly, the insulation layer 135 may protect the input wiring 133 and the output wiring 134 from moisture or dust from the outside, and may insulate the input wiring 133 and the output wiring 134 from the outside. Further, the insulation layer 135 may not overlap at least a portion of the input wiring 133 and the output wiring 134. Specifically, the insulation layer 135 is not disposed in some regions at one end and an opposite end of the base film 131 in the area where the input wiring 133 and the output wiring 134 are positioned. Accordingly, the pad portions 133*a*, 134*a*, which are defined as regions where the input wiring 133 and output wiring 134 positioned at one end and the opposite end of the base film 131 are exposed, may be formed.

Then, the semiconductor chip 132 is mounted on the base film 131 on which the input wiring 133, the output wiring 134, and the insulation layer 135 are formed (S603). That is, the semiconductor chip 132 is electrically connected to the input wiring 133 and the output wiring 134. In this case, the semiconductor chip 132 may be positioned overlapping the insulation layer 135 at an edge. The insulation layer 135 overlapping the semiconductor chip 132 may support the semiconductor chip 132.

Then, a protective layer 136 is formed between the semiconductor chip 132 and the output pad portion 134*a* (S604). That is, the protective layer 136 is positioned overlapping at least a portion of the output wiring 134 to protect the output wiring 134. Specifically, the protective layer 136 may have a width W greater than or equal to a predetermined minimum width and a thickness T greater than or equal to a predetermined minimum thickness with respect to the first direction D1, and may be arranged to be spaced apart from the output pad portion 134*a* by a predetermined minimum separation distance. In this case, the protective layer 136 may be formed using a resin application device including a needle 601 and a head 602, as shown in FIG. 7. In this case, a material constituting the protective layer 136 may be applied by changing the type of the head 602 according to the viscosity of the material constituting the protective layer 136. For example, the higher the viscosity of the material constituting the protective layer 136, the larger the size of the head 602 may be. When the material constituting the protective layer 136 has a high viscosity, a head 602 of the nozzle type may be used to form the protective layer 136. When the material constituting the protective layer 136 has a low viscosity, a head 602 of the fiber type may be used to form the protective layer 136. Further, as described above, the protective layer 136 may include a resin to effectively protect the output wiring 134 and the insulation layer 135.

In FIG. 6 and the foregoing description, forming the insulation layer 135 (S602), mounting the semiconductor chip 132 (S603), and forming the protective layer 136 (S604) have been described as being performed sequentially. However, mounting the semiconductor chip 132 (S603) may be performed after forming the insulation layer 135 (S602), after forming the protective layer 136 (S604). After mounting the semiconductor chip 132 (S603), the insulation layer 135 may be formed and the protective layer 136 may be formed (S604).

As is apparent from the above description, the present disclosure has the following effect.

A chip-on-film package including a protective layer according to one embodiment of the present disclosure may avoid breakage caused by external impact.

It will be appreciated by those skilled in the art to which the present disclosure belongs that the disclosure described above may be practiced in other specific forms without altering its technical ideas or essential features.

It should therefore be understood that the embodiments described above are exemplary and non-limiting in all respects. The scope of the present disclosure is defined by the appended claims, rather than by the detailed description above, and should be construed to cover all modifications or variations derived from the meaning and scope of the appended claims and the equivalents thereof.

What is claimed is:

1. A chip on film package comprising:
a base film;
output wiring disposed on the base film and extending along a first direction;
an insulation layer overlapping at least a portion of the output wiring;
an output pad portion defined as a region in which the output wiring is exposed;
a semiconductor chip mounted on the base film and electrically connected to the output wiring; and
a protective layer disposed between the semiconductor chip and the output pad portion with respect to the first direction, and spaced apart from the output pad portion with respect to the first direction,
wherein the insulation layer is disposed between the output pad portion and the protective layer.

2. The chip on film package of claim 1, wherein the protective layer is spaced apart from the output pad portion by 10 um or more.

3. The chip on film package of claim 1, wherein the protective layer has a width greater than or equal to a predetermined minimum width with respect to the first direction.

4. The chip on film package of claim 1, wherein the protective layer has a thickness greater than or equal to a predetermined minimum thickness.

5. The chip on film package of claim 1, wherein the protective layer is positioned on the insulation layer.

6. The chip on film package of claim 1, wherein the protective layer is positioned on a first surface of the base film.

7. A chip on film package comprising:
a base film;
output wiring disposed on the base film and extending along a first direction;
an insulation layer overlapping at least a portion of the output wiring;
an output pad portion defined as a region in which the output wiring is exposed;
a semiconductor chip mounted on the base film and electrically connected to the output wiring; and
a protective layer disposed between the semiconductor chip and the output pad portion with respect to the first direction and having a width greater than or equal to a predetermined minimum width,
wherein the insulation layer is disposed between the output pad portion and the protective layer spaced apart from the output pad portion with respect to the first direction.

8. The chip on film package of claim 7, wherein the width of the protective layer is greater than or equal to 1 mm with respect to the first direction.

9. The chip on film package of claim 7, wherein the protective layer has a thickness greater than or equal to a predetermined minimum thickness.

10. The chip on film package of claim 7, wherein the protective layer is spaced apart from the output pad portion by 100 um or more.

11. The chip on film package of claim 7, wherein the protective layer is positioned on the insulation layer.

12. The chip on film package of claim 7, wherein the protective layer is positioned on a first surface of the base film.

13. A display device comprising:

a display panel comprising a plurality of data lines and a plurality of gate lines;

a chip on film package; and a panel mechanism positioned between the display panel and the chip on film package, wherein the chip on film package comprises:

a base film;

output wiring disposed on the base film and extending along a first direction;

an insulation layer overlapping at least a portion of the output wiring;

an output pad portion defined as a region in which the output wiring is exposed;

a semiconductor chip mounted on the base film and electrically connected to the output wiring; and a protective layer disposed between the semiconductor chip and the output pad portion with respect to the first direction and having a thickness greater than or equal to a predetermined minimum thickness, wherein the insulation layer is disposed between the output pad portion and the protective layer spaced apart from the output pad portion with respect to the first direction.

14. The display device of claim 13, wherein the protective layer is spaced apart from the output pad portion by 100 um more.

15. The display device of claim 13, wherein the protective layer has a width greater than or equal to a predetermined minimum width with respect to the first direction.

16. The display device of claim 13, wherein the thickness of the protective layer is greater than or equal to 15 um.

17. The display device of claim 13, wherein the protective layer is positioned on a first surface of the base film.

18. The display device of claim 13, wherein the protective layer is positioned on the insulation layer.

19. The display device of claim 13, wherein the protective layer is positioned on a first surface of the base film having the output wiring and the insulation layer formed thereon.

20. The display device of claim 13, wherein the protective layer has a width less than or equal to a width of the insulation layer with respect to a second direction.

* * * * *